United States Patent [19]

Conaway

[11] Patent Number: 4,719,631
[45] Date of Patent: Jan. 12, 1988

[54] CONDUCTIVELY COOLED LASER DIODE ARRAY PUMPED LASER

[75] Inventor: Larry K. Conaway, St. Louis County, Mo.

[73] Assignee: The United States of America as represented by the Secretary of the Air Force, Washington, D.C.

[21] Appl. No.: 817,637

[22] Filed: Jan. 10, 1986

[51] Int. Cl.⁴ .................................................. H01S 3/04
[52] U.S. Cl. .......................................... 372/34; 372/75; 372/33
[58] Field of Search .................. 372/34, 75, 43, 69-72

[56] References Cited

U.S. PATENT DOCUMENTS

| | | | |
|---|---|---|---|
| 3,538,455 | 11/1970 | Florio | 372/75 |
| 3,555,452 | 1/1971 | Nielsen et al. | 372/75 |
| 3,683,296 | 8/1972 | Scalise | 331/94.5 |
| 3,711,789 | 1/1973 | Dierschke | 331/94.5 P |
| 3,760,175 | 9/1973 | Gibson et al. | 240/1 EL |
| 3,771,031 | 11/1973 | Kay | 317/235 R |
| 3,835,414 | 9/1974 | Ahearn | 372/43 |
| 3,878,556 | 4/1975 | Nyul | 357/81 |
| 3,962,655 | 6/1976 | Selway et al. | 372/36 |
| 4,315,225 | 2/1982 | Allen, Jr. et al. | 372/35 |
| 4,361,720 | 11/1982 | Resneau et al. | 174/16 HS |
| 4,454,602 | 6/1984 | Smith | 372/36 |

*Primary Examiner*—Leon Scott, Jr.
*Attorney, Agent, or Firm*—Jules J. Morris; Donald J. Singer

[57] ABSTRACT

A conductively cooled semiconductor laser 10 comprises a laser rod 14 surrounded by arrays 12 of laser diodes. The laser diodes 26 are mounted to ceramic plates 25 that are excellent heat extractors and electrical insulators. The ceramic plates 25 have steps 32, 34 which permit diode mounting without plate to plate interference when the plates are assembled into the arrays 12. Conductive coatings on selected portions of the ceramic plates is used to electrically connect the diodes.

10 Claims, 5 Drawing Figures

CONDUCTIVELY COOLED LASER DIODE ARRAY PUMPED LASER

STATEMENT OF GOVERNMENT INTEREST

The invention described herein may be manufactured and used by or for the Government for governmental purposes without the payment of any royalty thereon.

FIELD OF THE INVENTION

This invention relates to semiconductor lasers and is particularly related to conductively cooled laser diode assemblies containing a large number of injection laser diodes.

BACKGROUND OF THE INVENTION

Semiconductor injection lasers are pumped, or energized, by arrays of laser diodes and are generally used for long distance communications both in space and on earth. These lasers rely on many individual laser diode assemblies, also known as laser diode sandwiches, positioned around a rod of semiconductor material. The individual laser diodes, or injection diodes, emit laser light into the semiconductor rod to cause it to laze, which is to say that the semiconductor rod is stimulated to emit a high power coherent light impulse. Common semiconductor rods used for this type of laser are made of materials such as neodymium doped yttrium aluminum garnet (Nd:YAG).

Semiconductor injection lasers have many advantages for communications usage. Their small size and mechanical stability have permitted their use in harsh environments which are unsuitable for other types of laser devices. In addition the injection lasers are capable of very high efficiencies when compared to other types of lasers and may be used in continuous or pulsed modes of operations.

Power output of the injection laser, produced at the semiconductor rod, is dependent upon the amount of light directed into the rod by the individual laser diodes. To achieve maximum efficiency, as much light as possible should be directed into the rod. In order to achieve this, the injection diodes are packed as closely together as possible in a manner which permits the diodes to conduct a large amount of current and produce large amounts of laser light. As a result, the diodes produce a large amount of heat and must be cooled. In this particular application heat dissipation from the laser diodes is critical both to the efficiency and the longevity of the individual diodes in the injection laser. Further, since the diodes are quite small and are packed so closely together the heat dissipation problem is aggravated by the need to extract a large amount of heat from a very small area.

This problem has been addressed in the past mainly by circulating a chilled liquid through a heat conducting material that is thermally coupled to the laser diodes. In other words, a refrigerant is used to draw the heat energy away from the laser diodes in a manner similar to the use of coolants in high speed computers where components are densely packed together and produce large amounts of heat. This solution greatly increases the cost and power consumption of the overall laser device and is often unsuitable for space applications. Further, the increase in system complexity implied by an active conductive cooling system acts to decrease system reliability.

As a result of these factors, systems have been proposed that extract heat from laser diode arrays purely by passive conduction. Passive conduction is particularly suitable for space systems in vacuum. Such passive systems make use of large copper and aluminum heat sinks that transfer heat from the laser diodes to a heat dissipation means. These types of devices, some of which have been moderately successful, require the heat from the injection diodes to travel from the diodes into a copper heat sink mounting plate and from there through a dielectric spacer and an aluminum heat extractor. From there the heat is directed to a spacecraft or aircraft radiator. This process of heat tranfer across so many interfaces causes a large thermal impedance. Large thermal impedances result in high laser diode operating temperatures which in turn result in diminished laser light output, low laser efficiency and shortened diode life.

All of the above factors act to limit the number of laser diodes that may be packed closely around the semiconductor rod and the amount of current that may be used to drive the diodes. It is an object of the present invention, therefore, to improve the heat transfer system between the laser diodes and the heat dissipation means so that an increased number of diodes can be operated at high power levels. This in turn would permit more efficient and more powerful injection lasers.

Another problem that presents itself with conventional cooling designs is a result of the thermal expansion mismatch between semiconductor diodes and the metal heat sinks they are generally mounted upon. In the case of copper, which is most common, the metal expands at nearly three times the rate of a typical semiconductor diode (per °C.) and as a result, large mechanical stresses are imposed on the diode. Such stresses cause early failure of diodes due to cracking and dark line defects in the optical emitting areas.

It is therefore an object of the present invention to provide an improved mounting arrangement for the laser diodes that will reduce mechanical stresses due to thermal mismatch.

SUMMARY OF THE INVENTION

The invention comprises a semiconductor laser powered by laser injection diodes mounted in an array of electrically insulating heat extraction plates.

The injection laser heat extraction plates are assembled into several arrays which are positioned around a rod of semiconductor laser material such as Nd:YAG. Light emitted from the laser diodes of the arrays stimulates emission of coherent laser light from an end of the semiconductor rod.

In the preferred embodiment of the invention each laser diode is mounted upon a single flat heat extraction plate substantially fabricated from beryllium oxide. Beryllium oxide is a ceramic material that has good heat conducting properties but does not conduct electricity. In the preferred embodiment of the invention the beryllium oxide plate conducts heat away from the heat generating laser diodes.

It is preferred that the beryllium oxide plates will be selectively covered with a conducting material that provides electrical contact to laser diodes mounted thereon. In order to cover the beryllium oxide plates with a conducting material, an undercoat of a refractory metal such as tungsten or molybdenum is generally required. Silver or gold can be used as the conducting material on top of such a coating.

The mounting structure for laser diodes also preferably comprises steps cut in flat surfaces of the beryllium oxide plates. A step is provided for each diode on the plate and diodes are thereby mounted immediately adjacent to each other without physical contact therebetween. Further, the steps are used to provide easy electrical connection of the diodes to electrically conductive plated areas of each plate.

A soft heat conducting material such as gold or indium is inserted between the plates in a thin layer when the plates are assembled into an array. This material fills any irregularities between the plates and prevents formation of thermally or electrically insulating gaps.

BRIEF DESCRIPTION OF THE DRAWINGS

The foregoing and other objects and advantages of the invention will be apparent from the following more particular description of the preferred embodiment of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF THE INVENTION

Figure 1:
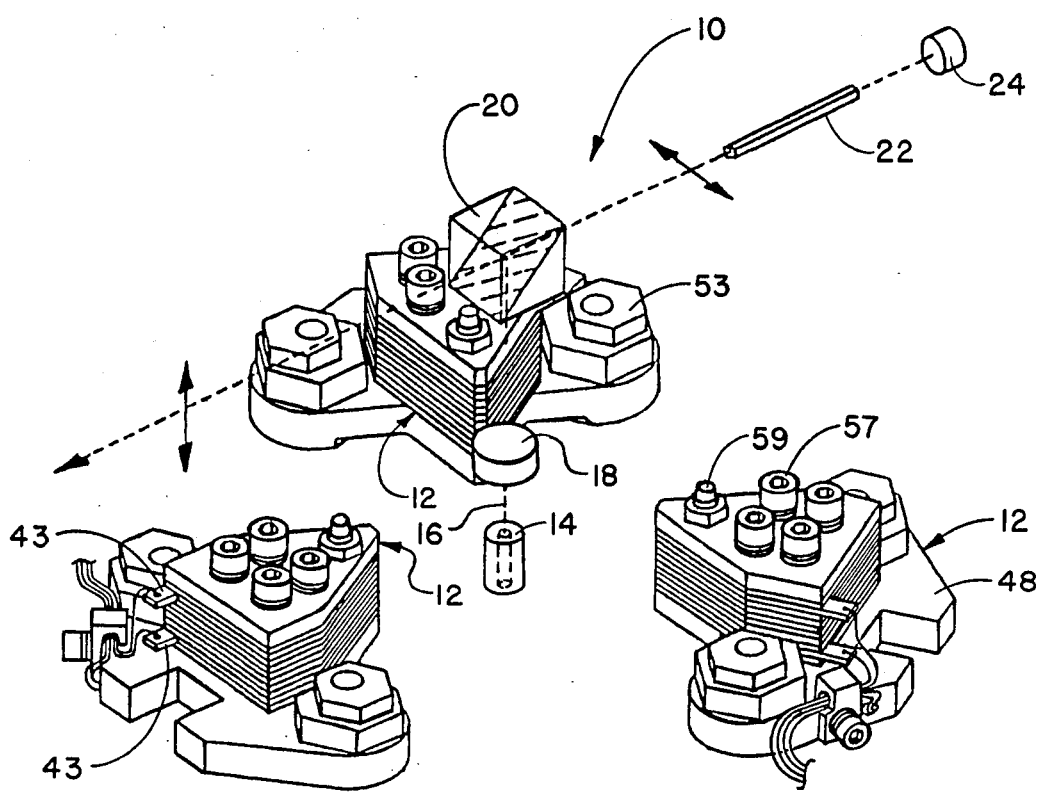
FIG. 1 is a schematic pictorial of a laser having three injection laser diode arrays for causing stimulated emission of light from a rod of laser material.

A semiconductor injection laser 10 incorporating the improvements of this invention is shown schematically in FIG. 1. This type of laser makes use of laser diode arrays 12 to pump, with laser light, a semiconductor rod 14 and cause it to laze, or emit coherent light, in one strong beam. This beam is shown by a dotted line 16. Typically, an intracavity lens 18 is used to help focus the beam upon a polarizer 20. The beam then travels through a modulator crystal 22 and is reflected by a mirror 24 back through the polarizer 20 to form an output beam 26. As mentioned above, this type of output beam is particularly suitable for long distance communications.

Typically the semiconductor rod 14 is formed from a material known as neodymium doped yttrium aluminum garnet (Nd:YAG) but other suitable materials may be used. The output power of the rod is dependent upon the amount of light put into it by the surrounding laser diode arrays 12. To achieve maximum efficiency the maximum amount of light should be fed into the rod.

In order to inject sufficient light to stimulate the emission of laser light from the rod the diodes must conduct a large electric current. Typically this current produces ¼ of a watt of heat per diode. Heat thus formed must be extracted away from the diodes otherwise diode reliability, output light wavelength, and efficiency will all be affected by increases in operating temperature. Unlike previous laser diode pumped lasers of this type, the laser of this invention is successful in extracting heat from the laser diode assemblies purely by efficient passive conduction. This is a great advantage in simplifying cooling systems, especially in the vacuum of space where conduction is the preferred means of cooling.

In order to increase diode cooling efficiency it is necessary to provide the shortest possible heat conduction path away from the diode. This results in the lowest possible thermal impedance between the diode and the radiator which sheds the heat to the environment. In the simplest terms, lowering the thermal impedance between the diode and the radiator lowers the temperature of the diode and thereby increase diode efficiency, reliability and lifetime.

Figure 2:
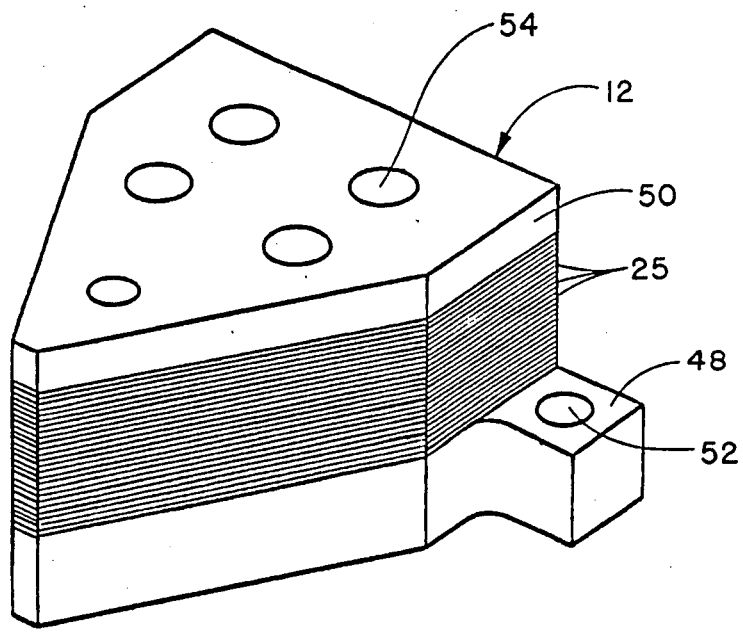
FIG. 2 is a isometric drawing of one of the diode arrays of FIG. 2.
Figure 3:
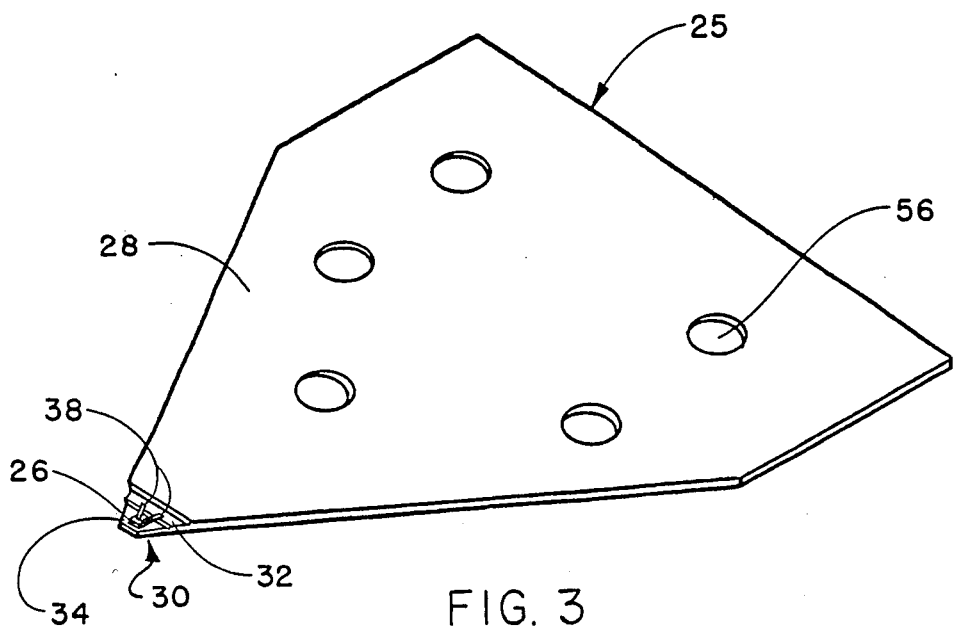
FIG. 3 is a isometric drawing of a single injection laser diode and its mounting platform.

The way in which this invention achieves substantial cooling with passive conductance may be seen more readily with reference to FIGS. 2 and 3. FIG. 2 shows an array 12 of injection laser diode sandwiches 25 and FIG. 3 shows a single laser diode sandwich 25.

Figure 4:
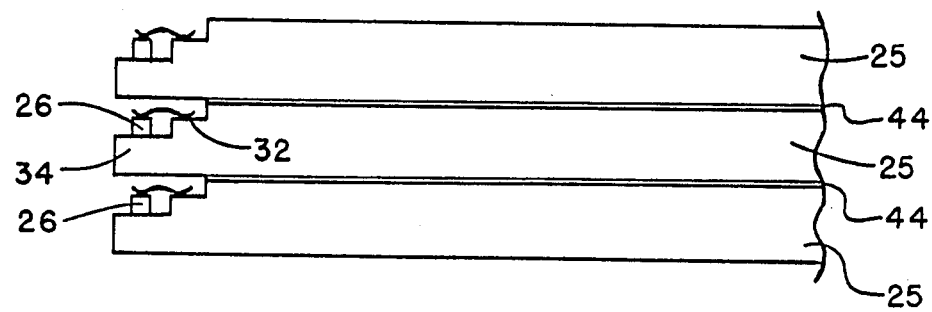
FIG. 4 is a segmented plan view of three assembled diodes and their adjacent mounting platforms.
Figure 5:
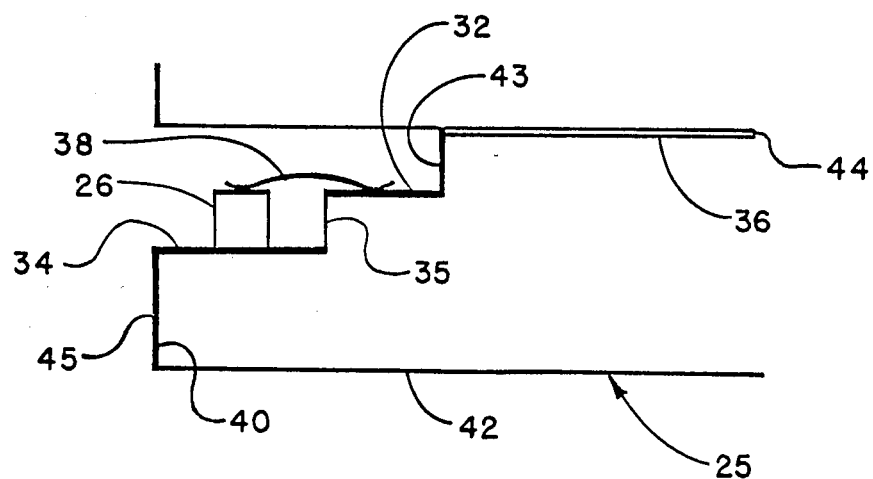
FIG. 5 is a segmented closeup plan view of a laser diode mounting area of FIG. 4.

Each laser diode assembly 25, or sandwich, is constructed on a ceramic plate 28. The plate comprises a delta shaped piece of beryllium oxide (BeO) substrate 28 upon which is located a single laser diode 26 at delta point 30. Two steps 32, 34 are ground in the beryllium oxide substrate (FIGS. 3, 4 and 5). These steps form the mounting seat for the laser diode. The diode is glued or otherwise attached to bottom step 34 and electrical contacts are provided to top step 32. These steps provide for stacking of sandwiches 25 without contact between diodes.

The beryllium oxide substrate forms an excellent heat extractor for the diode 26. Beryllium oxide is a ceramic material that does not conduct electricity. It is, however, an excellent conductor of heat. This is unusual because most materials that conduct heat well also conduct electricity. This invention takes advantage of this unusual property of beryllium oxide to use it as an effective heat conduction path while electrically insulating the diodes of the array.

Beryllium oxide also provides an improved substrate for the diode since its thermal coefficient of expansion (6.9 ppm/°C.) is very close to that of a typical semiconductor laser diode (6.3 ppm/°C.). As a result, relatively little mechanical stress is created in the diode due to changes in diode sandwich temperature. This reduction of mechanical stresses offers a great reliability improvement over previous substrate metals such as copper. Copper has a thermal coefficient of expansion close to three times that of the typical laser diode, as a result large stresses are created with changes in temperature and this increases the chances of stress induced diode failures.

Gold or silver is typically applied over a refractory metal such as tungsten or molybdenum to provide a conductive layer on the BeO plate for electrical connections of the diodes. The refractory metal provides good adhesion between the BeO substrate and the conductive material. The conductive layer or strip, shown schematically by increased drawing line thickness at 43, 45 (FIG. 5), extends from the top surface 36 of the laser diode assembly 25 down to top step 32 (FIG. 5). A lead may then be soldered from a contact surface of the diode 26 to step 32 to provide a first electrical contact; in the view of FIG. 3 two duplicate leads 38 are shown. The electrical circuit is completed by a contact between the base of diode 26 and gold material on bottom step 34 which extends over end 40 and base 42 of the laser diode assembly. Note that there is a break in the electrical conductive material at the end step 35 between top step 32 and bottom step 34, otherwise the circuit would bypass diode 26.

The laser diode sandwiches are assembled into a stacked array 12 (FIG. 2) by suitable clamping means. As the sandwiches are assembled, surfaces 36 and 42 on adjacent sandwiches make contact to electrically connect the diodes in series. The diode array is connected to a suitable power source by leads 43 (FIG. 1) connected to BeO plates at the top and bottom of the array 12.

A small layer of gold or indium 44 (FIG. 4) is squeezed between the individual sandwiches 25 as the laser sandwiches are assembled. Gold and indium are soft metals which help fill insulating gaps that might otherwise form between the sandwiches 25; these gaps would degrade heat transfer therebetween. The layer 44 therefore provides for excellent heat transfer between the sandwiches in order to aid in heat extraction from the diodes 26. Since beryllium oxide is a ceramic material it is somewhat brittle. The soft metallic layer 44 also serves to cushion the diode sandwiches during assembly and avoid assembly damage to the beryllium oxide plates 28.

After the desired number of laser diode sandwiches are assembled together a base plate 48 (FIG. 2) and a top plate 50 are assembled at each end of the laser diode array 12. These plates serve to protect the laser diode sandwiches and provide a mounting fixture for the assembled array 12 with which it can be positioned adjacent to the semiconductor rod.

The base plate 48 is provided with mounting holes 52 for attachment to a laser structure with bolts 53 (FIG. 1). Base plate 48 and top plate 50 both are provided with clamping holes 54 therethrough. Clamping holes 54 correspond with holes 56 in the laser sandwich 25. Non-conducting clamping means 57, 59 (FIG. 1) such as nylon nuts and bolts can be used in these holes to firmly clamp the laser diode array 12 together. Tightly squeezing the sandwiches with the clamping means also aids in promoting heat transfer therebetween. Typically, both the mounting plates and top plates are constructed of aluminum and provide part of the heat path between the laser diode sandwiches and the radiator means. Heat therefore travels from the heat extractor ceramic plates 28 into the base and top plates and hence to the radiator. Material such as aluminum provide excellent heat transfer paths.

The laser diode structure described above provides several advantages over the prior art. For example, each of the diode sandwiches can be individually tested and characterized prior to assembly into an array 12. By characterizing each individual laser diode prior to assembly of the arrays the diodes can be closely matched. This results in increased array reliability and uniformity.

The use of ceramic BeO plates 28 as the laser diode substrate results in much lighter arrays than similar metallic arrays. It is estimated that such arrays may be as much as 25% lighter than copper based arrays. This is a great advantage in spacecraft and aircraft where weight is an important consideration.

Each of the laser sandwiches 25 minimizes thermal impedance by minimizing the heat transfer path. As a result of the use of a one piece heat extractor construction these arrays are also considerably thinner than multi-layer arrays that make use of aluminum or copper plates in between the diode assemblies. The combination of high efficiency thermal extraction and reduced sandwich thickness permits up to 30% more diodes to be added to an array of this type as compared to a conventional array of similar size. Output laser power is increased as a result of the increase in number of diodes capable of high power operation.

It should also be noted that arrays made in the manner of the laser array 12 are easy to repair after diode failure. Repair is simply a matter of exchanging a failed diode sandwich 25 for a new one. This repair, however, is considerably less important in the type of laser diode array described above than in similar conventional arrays, due to the increased reliability inherent in operating cooler diodes subject to less thermal expansion generated stresses.

While the invention has been particularly described with reference to the preferred embodiment thereof, it will be understood by those skilled in the art that various changes in substance and form can be made therein without having departed from the spirit and the scope of the invention as detailed in the attached claims.

I claim:

1. A conductively cooled laser diode array comprising:
   (a) flat ceramic plates made substantially from heat conducting beryllium oxide;
   (b) electrically conductive material applied to a portion of said plates;
   (c) laser diodes affixed directly to said plates and electrically connected to said electrically conductive material on said plates; and
   (d) clamping means for assembling a stack of said plates into said conductively cooled laser diode array wherein said plates are stacked immediately adjacent to each other and form a heat path for dissipating heat produced by said laser diodes.

2. The conductively cooled laser diode array of claim 1 further comprising a soft heat conducting material interposed between said plates in order to increase heat conduction between said plates by eliminating insulating gaps therebetween and which also serves to cushion said plates from mechanical damage.

3. The conductively cooled laser diode array of claim 1 wherein said flat plates are further characterized by a recessed mounting seat for attaching said laser diodes at a corner of said flat plate.

4. The conductively cooled laser diode array of claim 1 wherein said clamping means comprises electrically non-conducting means which passes through holes in said ceramic plates in order to assemble said stack of said ceramic plates.

5. The conductively cooled laser diode array of claim 1 wherein said ceramic plates are coated with a refractory material to promote good adhesion of said electrically conductive material which is applied prior to mounting of said laser diodes onto said plates and assembly of said ceramic plates into an array.

6. A laser diode pumped array laser comprising:
   (a) a rod of semiconductor laser material; and
   (b) at least two arrays of laser diode sandwiches for injecting light into said rod of semiconductor laser material in order to cause said rod to lase, said laser diode sandwiches comprising:
      (i) a plurality of heat conducting electrically insulating ceramic plates;
      (ii) laser diodes mounted directly to said ceramic plates;
      (iii) electrically conducting means for electrically connecting said diodes, and (iv) clamping means for assembling said ceramic plates and said diodes into said arrays.

7. The laser diode pumped array of claim 6 further comprising a soft heat conducting material interposed between said ceramic plates in order to increase heat conduction between said ceramic plates by eliminating insulating gaps therebetween and in order to cushion said plates from mechanical damage.

8. The laser diode pumped array of claim 6 further comprising:

(a) recessed mounting seats for attaching said laser diodes at corners of said ceramic plates.

9. The laser diode pumped array of claim 6 wherein said clamping means comprises electrically non-conducting means which pass through holes in said ceramic plates in order to clamp together said array of said laser diode sandwiches.

10. The laser diode pumped array of claim 6 wherein said electrically conducting means comprises a conductive metal coating selectively applied to said ceramic plates.

* * * * *